United States Patent [19]
Norris

[11] Patent Number: 4,468,569
[45] Date of Patent: Aug. 28, 1984

[54] MEANS OF IMPROVING THE UTILIZATION OF ENERGY AVAILABLE FROM A SOLAR ELECTRIC GENERATOR

[75] Inventor: Edgar T. Norris, Toowoomba, Australia

[73] Assignee: Toowoomba Foundry Pty. Ltd., Queensland, Australia

[21] Appl. No.: 417,825

[22] Filed: Sep. 13, 1982

[30] Foreign Application Priority Data

Oct. 9, 1981 [AU] Australia .............................. PF1124

[51] Int. Cl.3 ....................... H03K 3/295; H02H 3/08; G05F 1/56; G05F 5/00

[52] U.S. Cl. ................................... 290/1 R; 323/299; 323/300

[58] Field of Search ................ 323/299, 300; 290/1 R

[56] References Cited

U.S. PATENT DOCUMENTS

| | | | |
|---|---|---|---|
| 3,719,859 | 3/1973 | Frantz et al. | 323/299 X |
| 3,754,182 | 8/1973 | Morris et al. | 323/299 |
| 4,042,856 | 8/1977 | Steigerwald | 323/299 X |
| 4,096,393 | 6/1978 | Sher | 290/1 R |
| 4,230,970 | 10/1980 | Potter et al. | 323/299 X |
| 4,315,305 | 2/1982 | Siemon | 323/300 X |
| 4,377,781 | 3/1983 | Tatsushi et al. | 323/299 |
| 4,380,730 | 4/1983 | Morton, Jr. | 323/300 |

*Primary Examiner*—J. V. Truhe
*Assistant Examiner*—Terry Flower
*Attorney, Agent, or Firm*—Jim Zegeer

[57] ABSTRACT

The varying impedance of a solar generator is matched with the fixed or varying impedance of a load driven therefrom by comparing the generator voltage with a reference voltage and producing a difference signal indicative of the difference, if any, in the voltages, repetitively switching "on" and "off" the current flow from the generator to the load according to the voltage difference so as to maintain the generator voltage at a substantially constant level. Energy generated during periods when current is not supplied to the load is stored for supply during periods when current is switched on to the load.

8 Claims, 3 Drawing Figures

MEANS OF IMPROVING THE UTILIZATION OF ENERGY AVAILABLE FROM A SOLAR ELECTRIC GENERATOR

FIELD OF THE INVENTION

This invention relates to a method of, and apparatus for, improving the utilization of energy available from a solar electric generator.

BACKGROUND OF THE INVENTION

Solar cells, including silicon and other semiconductor solar cells are increasingly used in extraterrestial and earthbased uses. Such cells singly or connected in an array are herein referred to as a solar electric generator.

A problem associated with the application of a solar generator for driving an electric motor or other load arises from the characteristic of these cells which causes their output power to vary with the intensity of the sunlight falling upon them.

It is known that in order to transfer the maximum amount of power from a generating source to a load, the source impedance or resistance must be equal to the load impedance or resistance. (The term impedance will be used to mean impedance or resistance).

When the output of a solar electric generator varies with the light intensity, its effective source impedance varies also. This means that the maximum power transfer from the solar electric generator cannot take place at all light levels when connected to a given fixed load. The problem of maximum power transfer is further compounded by an initial impedance mismatch, if any, between the load and the solar electric generator or by any variation in the load.

An object of this invention to match the varying impedance, at varying light levels, of a solar electric generator to the fixed, or unrelated varying, impedance of a load being driven therefrom.

SUMMARY OF THE INVENTION

According to one aspect the invention consists in apparatus for matching the electrical impedance of a solar electric generator and a load driven therefrom, comprising:

circuit means for comparing the generator voltage and a predetermined voltage to produce a difference signal indicative of the difference if any in said voltages, control means for repetitively switching on and off the current flow from the generator to the load, the control means being responsive to the difference signal to vary the duration that said current is switched on relative to the duration that said current is switched off so as to maintain the generator voltage at a substantially constant level, and storage means for storing energy generated by the generator during the periods that current is switched off the load.

For preference the control means is a semi-conductor switch operated by a repetitive signal which is pulse width modulated according to the voltage difference between the generator output and a reference. The energy storage means may be a storage capacitor.

By repetitively interrupting the current to the load on the generator it is possible to maintain the generator terminal voltage at or near an optimum constant level and the transfer of power from the generator to the load can be maximized nothwithstanding variation in load impedance or in light intensity.

BRIEF DESCRIPTION OF THE DRAWINGS

By way of example only an embodiment of the invention will now be described with reference to the accompanying drawings wherein.

DETAILED DESCRIPTION OF THE INVENTION

Figure 1:
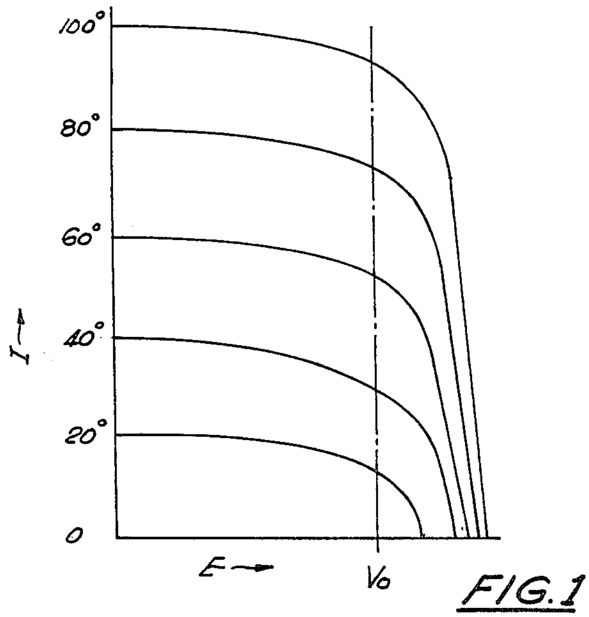
FIG. 1 shows schematically the voltage/current characteristics typical of a solar generator.

The voltage/current characteristic of a typical silicon solar cell or array thereof is as shown in FIG. 1. It can be shown that with this type of curve, the maximum power output ie. $E \times I$ occurs on the knee of the curve. Thus if the load is so adjusted as to maintain a nearly constant voltage from the cell at any light level, then the load will always receive close to the maximum power available. In other words if the cell voltage remains constant there is an impedance match between the cell and the load.

Figure 2:
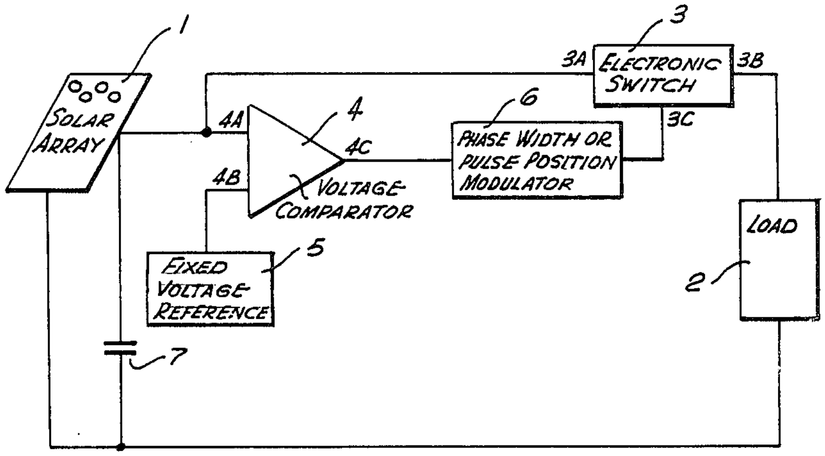
FIG. 2 is a block diagram showing an embodiment according to the invention.

FIG. 2 is, by way of example only, a block diagram of one type of regulating circuit which achieves this. The output of solar generator 1 goes to the load 2 via terminals 3A and 3B of an electronic switch 3 and also to one input 4A of a voltage comparator 4. The other input 4B of the voltage comparator 4 is connected to a voltage reference source 5 such as a zener diode. The resulting difference signal at 4C is then used at 6 for pulse width control, or pulse position (pulse interval) control, of a square wave signal used at terminal 3C in turn to control the on-off cycle of electronic switch 3. Switch 3 may be a transistor, a MOSFET, an SCR, or any other type of semiconductor switch. In order to supply load 2 with the required current pulses, storage means such as for example a capacitor of sufficient size is preferably connected across solar generator 1 to store its energy during the off time and so smooth the pulsing load on the generator.

Figure 3:
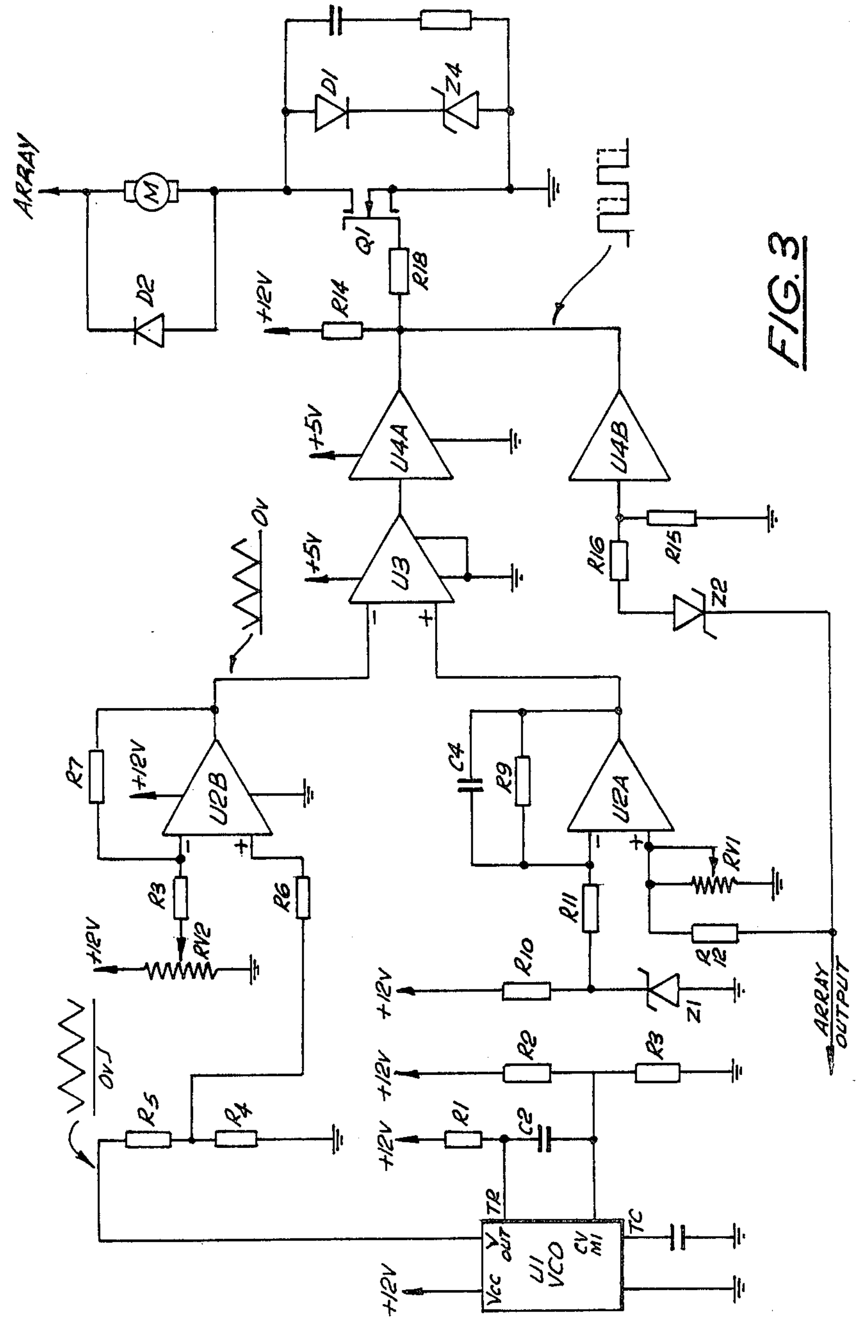
FIG. 3 is a schematic circuit diagram of an embodiment of the invention.

By way of further example, a schematic circuit diagram of a typical regulator for driving an electric motor load is shown in FIG. 3. A reference voltage is provided by Zener diode Z1 and this is compared with a proportion of the solar generator's output voltage, the error difference between the two being amplified by the operational amplifier U2A. The potentiometer RV1 is used to set the operating voltage to the optimum level.

Integrated circuit U1 is a voltage controlled oscillator used to produce a triangular wave output which by means of operational amplifier U2B has its dc offset modified so that the triangular wave output extends from zero upwards. This triangular wave is fed to one input of comparator U3 while its other input is fed with the difference signal from U2A. The output of U3 now becomes a pulse width modulated signal, the duty cycle of which becomes a function of the error signal.

The modulated output of U3 goes to U4A, a high voltage open collector buffer, which provides the drive to turn on the electronic switch Q1. Diode D2 carries free wheeling current caused by the motor inductance. Components D1, Z4, C14, and R17 absorb transient switching spikes.

The components Z2, R16, R15 and U4B permit the control circuit to start up correctly without any significant load being connected to the generator.

Although the invention has been described with reference to an electronic switch operated by a square wave signal which is pulse width modulated, it will be apparent that a switch operated by a pulse interval modulated control signal or a switch operated by a fixed frequency signal together with a frequency modulated signal or other control signal means could be employed to interrupt current from the generator to the load and it will be apparent to those skilled in the art from the teaching hereof that circuits for carrying the inventive concept hereof into effect could be implemented in a variety of ways without departure from the inventive concepts hereof.

I claim:

1. Apparatus for matching the electrical impedance of a solar electric generator and a load driven therefrom, comprising:

circuit means for comparing the generator voltage and a predetermined voltage to produce a difference signal indicative of the difference if any in said voltages, control means for repetitively switching on and off the current flow from the generator to the load, the control means being responsive to the difference signal to vary the duration that said current is switched on relative to the duration that said current is switched off so as to maintain the generator voltage at a substantially constant level, and storage means for storing energy generated by the generator during the periods that current is switched off the load.

2. Apparatus according to claim 1 wherein the control means comprises:

an electronic switch for controlling the flow of current from the generator to the load, and means responsive to the difference signal and a periodic signal to produce a control signal for switching on and off the electronic switch.

3. Apparatus according to claim 2 wherein the control signal comprises a pulse width modulated signal the pulse width of which changes as said voltage difference changes.

4. Apparatus according to claim 2 wherein the control signal comprises a pulse interval modulated signal the interval of which changes as said voltage difference changes.

5. Apparatus according to claim 1 wherein the energy storage means is a capacitor.

6. A method for matching the electrical impedance of a solar generator and a load driven therefrom comprising the steps of:

comparing the generator voltage and a predetermined voltage, and repetitively switching on and off the current flow from the generator to the load so as to vary the duration that the current is switched on relative to the duration that the current is switched off, and to maintain the generator voltage at a substantially constant level, storing energy generated while said current flow from the generator is switched off, and supplying generated energy and stored energy to the load when said current flow is switched on.

7. A method according to claim 5 or claim 6 wherein the substantially constant level of voltage is selected to be a voltage on the maximum power curve of the solar generator.

8. Apparatus for increasing the efficiency of transfer of electrical energy from a solar electric generator, whose output varies with light intensity, to a load, comprising, means providing a predetermined reference voltage, means for comparing the generator voltage and said predetermined reference voltage to produce a signal indicative of the difference in said voltages, switch means connecting the current from said generator to said load, and means for pulse width modulating the current flow from the generator to said load according to the voltage difference between the generator output and said predetermined reference voltage.

* * * * *